United States Patent [19]

Benndorf et al.

[11] Patent Number: 4,689,515

[45] Date of Patent: Aug. 25, 1987

[54] METHOD FOR OPERATING AN ULTRASONIC FREQUENCY GENERATOR

[75] Inventors: Gerald Benndorf, Bayreuth; Klaus Van der Linden, Kronach, both of Fed. Rep. of Germany

[73] Assignee: Siemens Aktiengesellschaft, Berlin and Munich, Fed. Rep. of Germany

[21] Appl. No.: 910,959

[22] Filed: Sep. 24, 1986

[30] Foreign Application Priority Data

Sep. 30, 1985 [DE] Fed. Rep. of Germany ....... 3534853

[51] Int. Cl.[4] ......................... H01L 41/08; B05B 3/14

[52] U.S. Cl. .................................. 310/316; 239/102.2

[58] Field of Search ............... 310/314, 316, 317, 318, 310/323; 239/102; 318/116, 118

[56] References Cited

U.S. PATENT DOCUMENTS

| | | | |
|---|---|---|---|
| 3,842,340 | 10/1974 | Brandquist | 310/316 X |
| 3,889,166 | 6/1975 | Scurlock | 310/316 X |
| 4,175,242 | 11/1979 | Kleinschmidt | 310/316 |
| 4,264,837 | 4/1981 | Gaboriaud | 310/316 X |
| 4,275,363 | 6/1981 | Mishiro et al. | 310/316 X |

FOREIGN PATENT DOCUMENTS

| | | | |
|---|---|---|---|
| 123277 | 10/1984 | European Pat. Off. . | |
| 1240316 | 5/1967 | Fed. Rep. of Germany . | |
| 3222425 | 12/1983 | Fed. Rep. of Germany | 310/316 |
| 7809428 | 10/1979 | France . | |
| 0760246 | 9/1980 | U.S.S.R. | 310/316 |

*Primary Examiner*—Mark O. Budd

*Attorney, Agent, or Firm*—Kenyon & Kenyon

[57] ABSTRACT

In an ultrasonic frequency generating assembly including a frequency generator coupled to a transducer through an output stage, a current measuring circuit is coupled to the output stage for sampling the current therethrough during each frequency burst upon the passage of a predetermined time interval following the onset of the respective frequency burst. The current value measured during a frequency burst is compared with a measured current value from an immediately preceding burst, the frequency output of the frequency generator being modified in accordance with the results of the comparison. The compared current values are stored in respective memories, the most recently measured current value being transferred from one memory to the other upon the termination of the comparison. A new current value is then loaded into the first memory.

18 Claims, 6 Drawing Figures

METHOD FOR OPERATING AN ULTRASONIC FREQUENCY GENERATOR

BACKGROUND OF THE INVENTION

This invention relates to a method for operating an ultrasonic frequency generating assembly. More particularly, this invention relates to a method for operating such an assembly with pulsed electric power and with automatic frequency control. The method in accordance with the invention is particularly useful for operating an ultrasonic frequency generating assembly for the atomization of a liquid.

European Patent Publication No. 123,277 discloses a method for operating an ultrasonic liquid atomizer wherein the electric energization power is supplied in pulsed form and is on the average sufficient for the adjusted quantity of liquid, while the peak power is so high that any temporary excess of liquid can be shaken off.

Ultrasonic liquid atomizers include electronic frequency generators which must, in general, be manually tuned to their respective fundamental operating frequencies. Ultrasonic atomizers affected by manufacturing tolerances may have different operating frequencies and, therefore, can not be interchanged without adaptation or balancing.

Methods of operating ultrasonic frequency generating assemblies with automatic frequency balancing have been disclosed. However, the ultrasonic generating assemblies with such automatic frequency balancing do not operate with pulsed electric power and do not have a defined operating point or a sufficient safety of operation with respect to the dislodging of a drop of liquid. Moreover, known circuit designs cannot ensure safe or reliable atomizer operation in case of changes in ambient temperature and in generator temperature due to inherent heating. This inability of known circuit designs to compensate for temperature changes arises from the limited trim range of the circuit designs.

An object of the present invention is to provide an improved ultrasonic frequency generating assembly of the above-described type.

Another, more particular, object of the present invention is to provide such an ultrasonic frequency generating assembly with automatic and continuous frequency trimming or adjustment.

Another particular object of the present invention is to provide such an ultrasonic frequency generating assembly which enables a reliable liquid atomization with automatic clearing of a flooded atomizer plate.

Further objects of the present invention are to provide such an ultrasonic frequency generating assembly which has low power consumption, low thermal stress and a high atomization rate.

Yet a further object of the present invention is to provide such an ultrasonic frequency generating assembly with automatic temperature monitoring.

SUMMARY OF THE INVENTION

The present invention is directed to a method for operating, with pulsed electric power and with automatic frequency control, an ultrasonic generating assembly for the atomization of liquid. The ultrasonic generating assembly includes an electronic frequency generator having an output stage connected to an electromechanical transducer.

In a first step of a method in accordance with the invention, current flowing through the output stage of the electronic frequency generator is measured upon the termination of a first time interval beginning at the onset of a first frequency burst produced by the frequency generator. The measurement occurs during a second time interval immediately following the first time interval, the first and second time intervals together having a duration less than the duration of the frequency burst. In a second step, the current flowing through the output stage is again measured upon the termination of a third time interval beginning at the onset of a second frequency burst produced by the frequency generator after termination of the first frequency burst. The second measurement occurs during a fourth time interval immediately following the third time interval, the third and fourth time intervals together having a duration less than the duration of the second frequency burst. In a third step, a first current value determined by the first measurement is compared with a second current value determined by the second measurement. In a fourth step, the frequency generator is controlled to modify the frequency burst output thereof in accordance with the results of the comparison. The modification of the frequency burst output of the frequency generator is limited so that the frequency burst output remains within a frequency band utilizable for atomization.

In carrying out the method set forth in claim 1, reliable atomization combined with low power consumption of the electronic frequency generator and a lower thermal stress of the ultrasonic atomizer is achieved. The optimum operating frequency of the ultrasonic atomizer is found quickly, inasmuch as only a restricted frequency range about the operating frequency of the ultrasonic liquid atomizer need be checked. In addition, the reliability and safety of atomizer operation is enhanced in an ultrasonic frequency generating assembly in accordance with the present invention because a latching in on a different frequency such as the composite resonance frequency of the ultrasonic atomizer, which latching would lead to destruction of the atomizer, does not occur.

Pursuant to further features of the present invention, the first current value is temporarily stored in a first memory upon measurement. The first current value is then transferred from the first memory to the second memory upon termination of the first frequency burst and prior to the onset of the second frequency burst. The second current value is temporarily stored in the first memory upon transfer of the first current value to the second memory and upon measurement of the second current value. The first and second current values are subsequently fed to a threshold circuit from the second memory and the first memory, respectively, the threshold circuit being used in the step of comparing. Preferably, the threshold circuit has a current threshold smaller than a current difference between a damped condition and an undamped condition of the transducer of the ultrasonic generating assembly or smaller than a current difference between lower and upper frequency range limits of the assembly.

Pursuant to additional features of the present invention, automatic frequency adaptation of the ultrasonic generating assembly is carried out from a low frequency to a high frequency and/or from a high frequency to a low frequency. Moreover, the frequency burst output of the frequency generator has a frequency increased one step per burst if the difference between the first current value and the second current value is less than a preset lower threshold value. The frequency of the burst output of the frequency generator is decreased one step per burst if the difference between the current values is greater than a preset upper threshold value.

In accordance with yet another feature of the invention, the temperature of the transducer is measured and operation of the ultrasonic generating assembly is terminated upon exceeding of a predetermined temperature limit by the temperature of the transducer.

DETAILED DESCRIPTION

Figure 1:
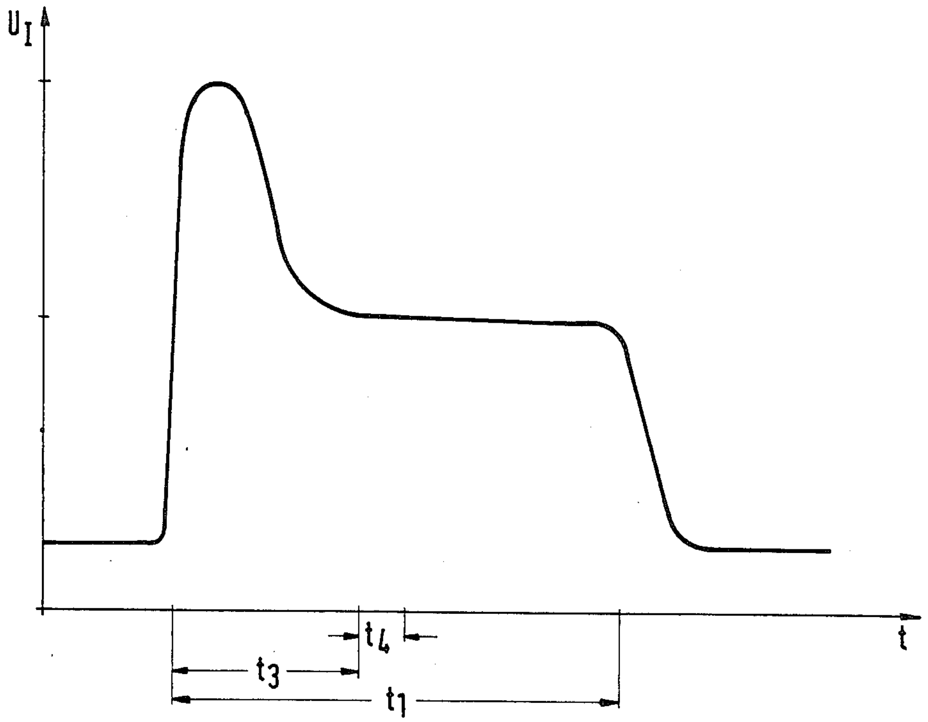
FIG. 1 is a voltage-time graph corresponding to the average current through an output stage of an ultrasonic electronic frequency generator during a single frequency burst produced by the generator for exciting an ultrasonic transducer of an atomizer.
Figure 2:
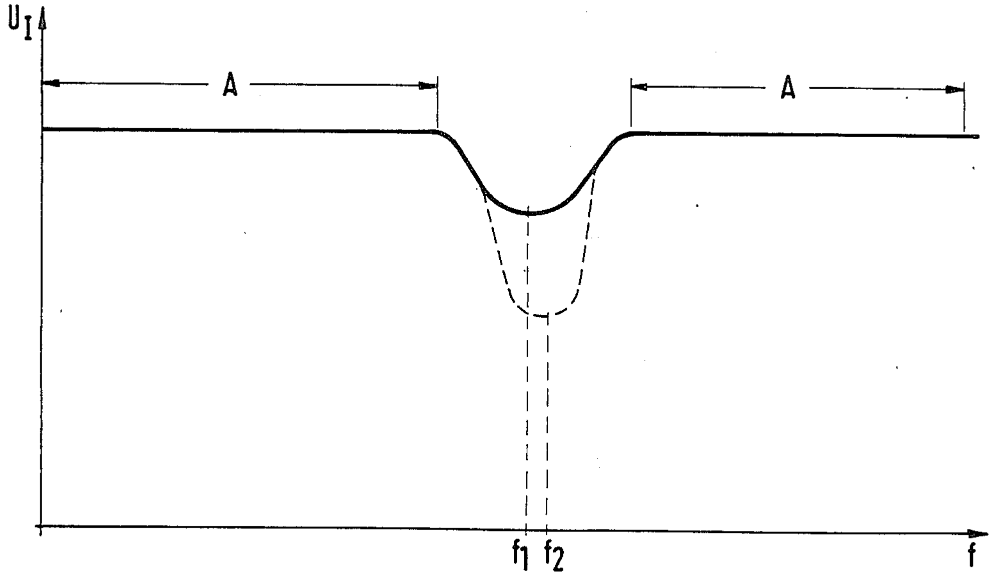
FIG. 2 is a voltage-frequency graph wherein the voltage is proportional to the current through the output stage of an ultrasonic electronic frequency generator.

As illustrated in FIG. 1, a transducer in an ultrasonic frequency generating assembly is excited with a frequency burst having a duration $t_1$. The decay time $t_2$, i.e., the time between successive frequency bursts, is generally larger than the pulse duration $t_1$, as illustrated in FIG. 2.

Figure 4:
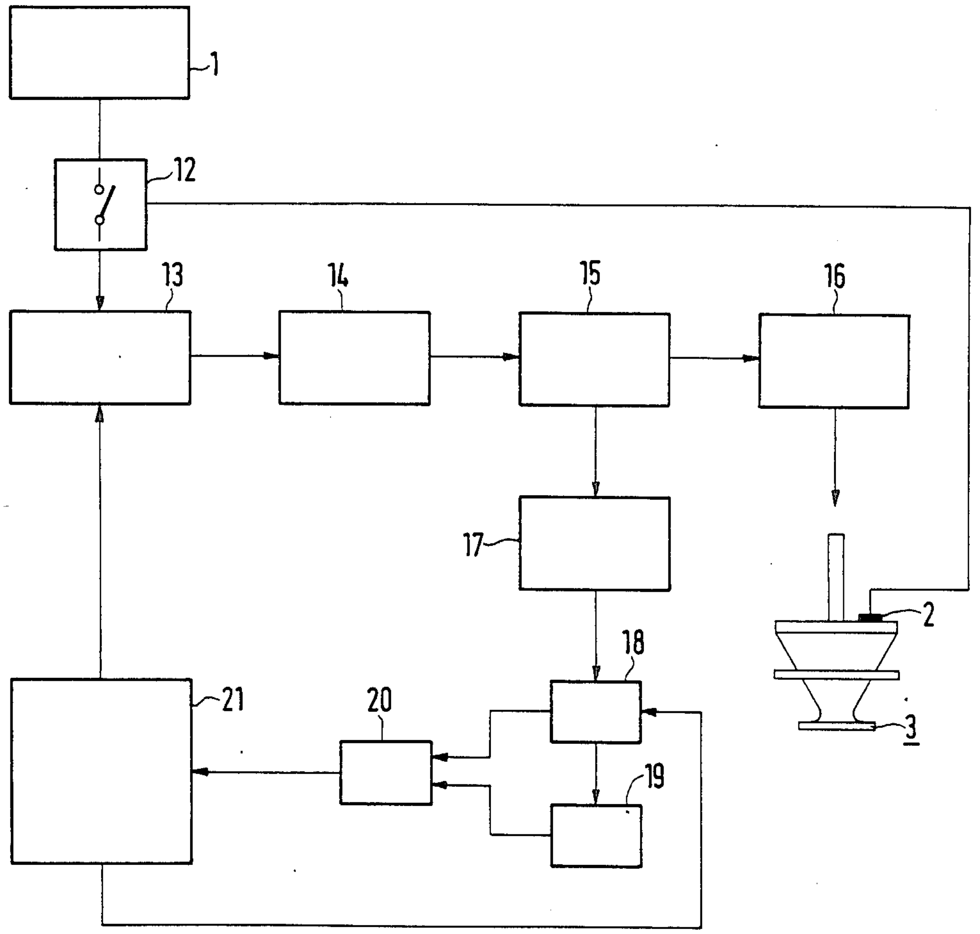
FIG. 4 is a block diagram of an ultrasonic generating assembly in accordance with the present invention, including a transducer device.

FIG. 4 shows in block-diagram form an ultrasonic frequency generating assembly which is operated by a method in accordance with the present invention. A voltage supply 1 is connected to a frequency generator 13 via an on/off switch 12. The frequency generator feeds a low-level stage 14 in turn connected to an output stage 15 of the frequency generator. Output stage 15 is coupled to a transducer 16, preferably in the form of a piezo-ceramic plate (e.g; reference number 4 in FIG. 5), and to a current measuring circuit 17. The current measuring circuit works into a first memory or data coil 18 having outputs tied to a second memory 19 and to a comparator 20. Memory 19 has an output also connected to comparator 20. Comparator 20 produces an output signal fed to an input of a frequency control unit 21 having a first lead 22 extending to frequency generator 13 for controlling the output frequency thereof and another lead 23 extending to memory 18 for controlling input and output of data to and from that memory, as well as into memory 19.

In a method in accordance with the invention for operating the ultrasonic frequency generating assembly of FIG. 4, the frequency of a frequency burst produced by generator 13 and fed to transducer 16 is adjustable by frequency control until 21 in response to a comparison of the currents measured at different times.

Current measuring circuit 17 monitors the current through output stage 15 and transforms that current into a voltage (see FIG. 1). A voltage value at the output of current measuring circuit 17 is loaded into memory 18 in response to an enable signal transmitted from frequency control unit 21 over lead 23. To avoid faulty current measurement, exemplarily due to transients, a current measurement during a frequency burst occurs only after a delay interval $t_3$ (see FIG. 1) after the frequency burst has commenced. The measurement takes place specifically during a measurement interval $t_4$ following immediately upon the termination of delay interval $t_3$.

During the interval $t_2$ between two successive frequency burst signals (see FIG. 3), the current value measured during interval $t_4$ of the first frequency burst is transferred from data store or memory 18 to data store or memory 19 (see FIG. 4). During the measurement interval $t_4$ of the second frequency burst, the current flowing through output stage 15 is again measured by circuit 17, the voltage value corresponding to the measured current being newly loaded into memory 18. During the second frequency burst, or thereafter, but prior to date transfer from memory 18 to memory 19, the current value newly loaded into memory 18 is compared by comparator 20 with the previously measured current value stored in memory 19.

If the difference between the first measured current value in memory 19 and the second measured current value in memory 18 is smaller than a preselected lower threshold value, frequency control unit 21 transmits a signal to frequency generator 13 via lead 22 to control the frequency generator to increase the frequency output thereof by one step per burst. Such a situation is likely to occur upon taking the circuit into operation when the optimum operating frequency is to be found.

If the difference between the measured current value in memory 19 and the measured current value in memory 18 is larger than a predetermined upper threshold value, the frequency of the output burst of generator 13 is lowered by one step per burst.

If the difference between the current values in memory 18 and 19 is between the lower and upper thresholds, the frequency search direction applicable in the preceding burst is maintained.

For a quicker leveling of operation frequency variations of the ultrasonic frequency generating assembly of FIG. 4 towards lower frequencies, caused by changes in ambient temperature or by inherent heating, the operating frequency of the electronic system is lowered by one step after a predetermined period.

FIG. 2 shows the variation of current as a function of frequency, the ordinate on the graph being a voltage drop across a resistance caused by the current through output stage 15. Frequency $f_1$ represents the operating point of the ultrasonic atomizer wherein the transducer device is flooded with liquid or is damped. Frequency $f_2$ represents the operating point or frequency of an undamped (i.e., dry) transducer device. Area A in FIG. 2 represents a range of frequencies not suitable for the atomization process.

As indicated in FIG. 2, the operating frequency of an ultrasonic frequency generating assembly, particularly an ultrasonic atomizer, can be determined very quickly by using the method in accordance with the invention of operating the ultrasonic atomizer. The operating frequency is determined regardless of whether the atomizer is damped (i.e. flooded) or slightly damped (the atomizing state), connected with an increase of the operating frequency of the ultrasonic atomizer. A further advantage of a method of operating an ultrasonic frequency generating assembly in accordance with the invention is that after the optimum atomizer operating frequency has been found, the circuit remains close to the optimum operating point. In the areas A (FIG. 2) outside of the optimum operating range, a constant current value is preset by appropriate circuit measures in order to enable the circuit to quickly latch onto the operating frequency of the atomizer.

Figure 3:
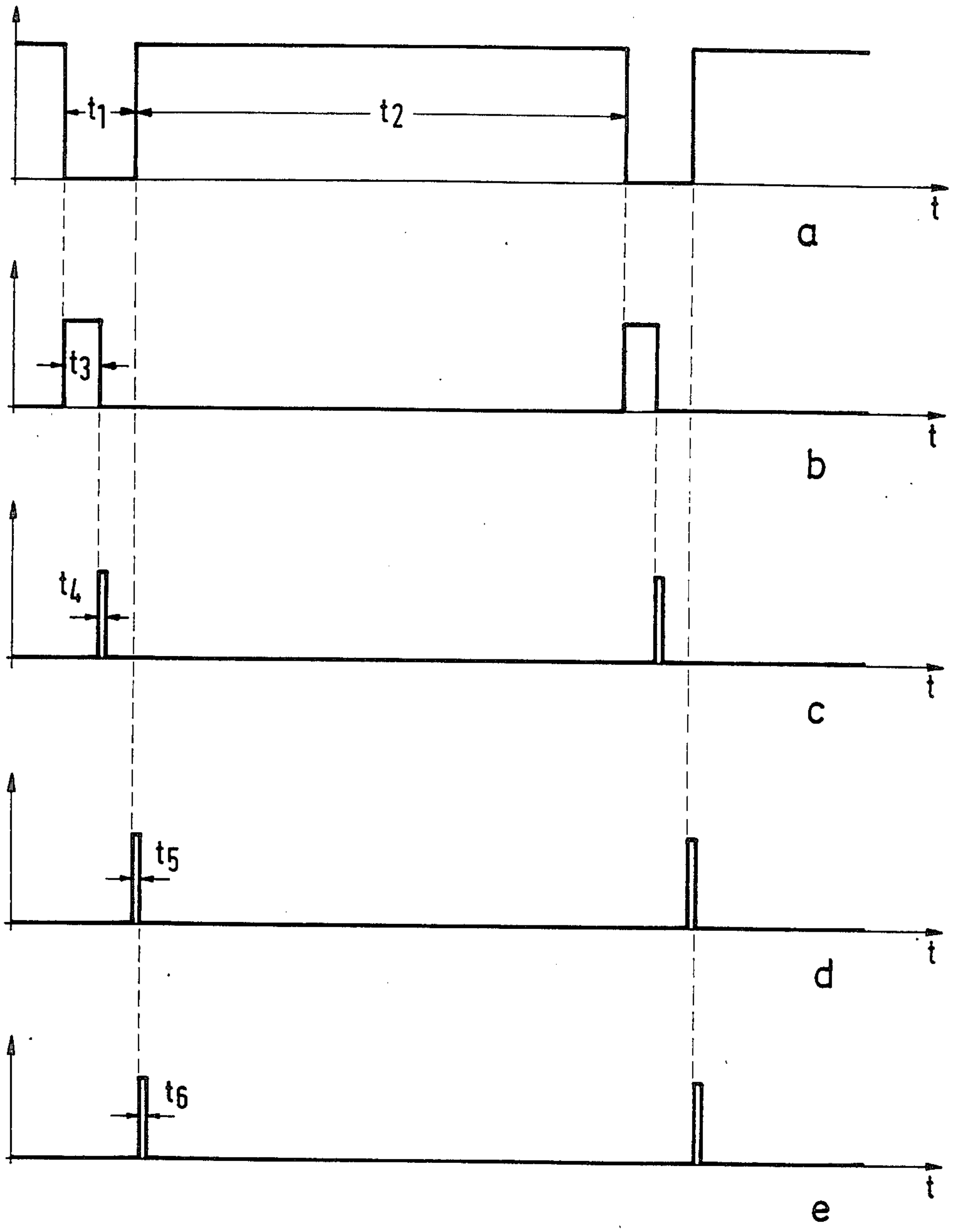
FIG. 3 is a set of graphs labeled a–e showing a sequence of time intervals relevant to a method, in accordance with the present invention, for operating an ultrasonic generating assembly for the atomization of liquid.

FIG. 3 is a series of five graphs depicting the relationships among several time intervals during which operating steps in accordance with the present invention occur. Graph a of FIG. 3 shows two intervals $t_1$ during which frequency bursts are produced by generator 13. The frequency burst periods or intervals $t_1$ are separated by an interval $t_2$. Graph b of FIG. 3 shows, within each of the two frequency burst intervals $t_1$ of graph a, a respective subinterval $t_3$ representing a delay after the onset of the respective frequency burst and prior to the measurement in interval $t_4$ (graph c) of the current flowing through output stage 15 (FIG. 4). Graphs d and e of FIG. 3 represent the transfer of the current value measured in the preceding interval $t_4$ from memory 18 to memory 19 (FIG. 4). During interval $t_5$, forming a subinterval of interval $t_2$ and immediately following interval $t_1$, counting pulses follow the respective burst signal. The comparison by comparator 20 of the current value stored in memories 18 and 19 may take place during interval $t_5$. At the end of interval $t_5$, data transfer from memory 18 to memory 19 occurs within time interval $t_6$.

Figure 5:
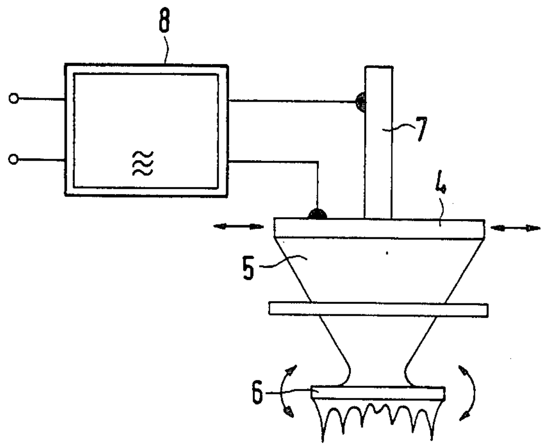
FIG. 5 is a schematic side elevational view, on an enlarged scle, of the ultrasonic transducer device of FIG. 4, showing, in addition, a schematic representation of an electronic control system.
Figure 6:
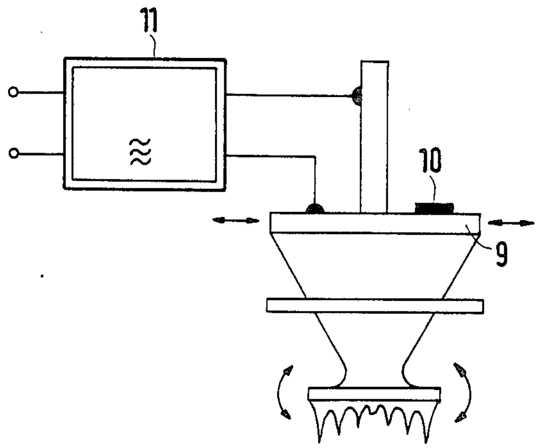
FIG. 6 is a schematic side elevational view similar to FIG. 5, showing a temperature-dependent resistor.

The method in accordance with the present invention is especially suitable for operating a piezoelectric ultrasonic atomizer with a piezoceramic transducer plate 4 connected to an amplitude transformer 5 in turn coupled to an atomizer plate 6 (see FIG. 5). To protect the ultrasonic liquid atomizer from damage due to excessive temperatures, which may arise from operating the transducer in a dry state, a temperature-dependent resistor 10 (FIGS. 4 and 6) is applied to piezoceramic plate 4 of the atomizer. The temperature-dependent resistor 10 is operatively connected to on/off switch 12 to open that switch upon the generation of an excessive temperature in the atomizer transducer. The electronic system, including output stage 15, remains de-energized until the ultrasonic atomizer transducer has cooled to a permissible temperature. As illustrated in FIGS. 5 and 6, a small tube 7 is integrated into the atomizer cone or transducer device for introducing the liquid thereto. The electronic circuit 8 for exciting piezoceramic transducer plate 4 is connected thereto as well as to tube 7.

Ultrasonic liquid atomizers operated in accordance with the present invention are especially suitable for the atomization of fuel, such as diesel oil and gasoline, for burners, engines, generators and stationary heaters, for cosmetics such as hair spray, deodorants and perfumes, for cleaning materials, medications for inhalation purposes and humidifiers, for small air conditioning chambers and terrariums and for use in installations for coating, humidifying and air conditioning.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the descriptions and illustrations herein are proffered by way of example to facilitate comprehension of the invention and should not be construed to limit the scope thereof.

What is claimed is:

1. A method for operating, with pulsed electric power and with automatic frequency control, an ultrasonic generating assembly for the atomization of liquid, said ultrasonic generating assembly including an electronic frequency generator having an output stage connected to an electromechanical transducer, said method comprising the steps of:

(a) measuring, upon the lapse of a first time interval beginning at the onset of a first frequency burst produced by said frequency generator, current flowing through said output stage of said electronic frequency generator, said step of measuring occurring during a second time interval immediately following said first time interval, said first and said second time interval together having a duration less than the duration of said frequency burst;

(b) measuring, upon the lapse of a third time interval beginning at the onset of a second frequency burst produced by said frequency generator after termination of said first frequency burst, current flowing through said output stage, said step (b) occurring during a fourth time interval immediately following said third time interval, said third and said fourth time interval together having a duration less than the duration of said second frequency burst;

(c) comparing a first current value measured in step (a) with a second current value measured in step (b); and (d) controlling said frequency generator to modify the frequency burst output thereof in accordance with the results of said step of comparing, the modification of the frequency burst output of said frequency generator being limited so that the frequency burst output remains within a frequency band usable for atomization.

2. The method according to claim 1, further comprising the step of temporarily storing said first current value upon measurement thereof.

3. The method according to claim 2 wherein, in said step of controlling, the frequency burst output of said frequency generator has a frequency increased one step per burst if the difference between said first current value and said second current value is less than a preset lower threshold value.

4. The method according to claim 3 wherein, in said step of controlling, the frequency burst output of said frequency generator has a frequency decreased one step per burst if the difference between said first current value and said second current value is greater than a preset upper threshold value.

5. The method according to claim 1 wherein automatic frequency adaptation of the ultrasonic generating assembly is carried out from a low frequency to a high frequency.

6. The method according to claim 5 wherein automatic frequency adaptation of the ultrasonic generating assembly is also carried out from a high frequency to a low frequency.

7. The method according to claim 1 wherein automatic frequency adaptation of the ultrasonic generating assembly is carried out from a high frequency to a low frequency.

8. The method according to claim 1, further comprising the steps of (e) temporarily storing in a first memory said first current value upon measurement thereof, (f) transferring said first current value from said first memory to a second memory upon termination of said first frequency burst and prior to the onset of said second frequency burst, (g) temporarily storing in said first memory said second current value upon measurement thereof and upon transfer of said first current value to said second memory.

9. The method according to claim 8, further comprising the step of feeding to a threshold circuit said first current signal from said second memory and said second current signal from said first memory.

10. The method according to claim 1 wherein a threshold circuit is used in said step of comparing.

11. The method according to claim 10 wherein said threshold circuit has a current threshold smaller than a current difference between a damped condition and an undamped condition of the transducer of the ultrasonic generating assembly.

12. The method according to claim 10 wherein said threshold circuit has a current threshold smaller than a current difference between lower and upper frequency range limits of the ultrasonic generating assembly.

13. The method according to claim 10, further comprising the step of setting a certain operating frequency range, current levels outside of said range being constant.

14. The method according to claim 1 wherein after a predetermined time interval said frequency generator runs one step counter to the search direction without influencing the search direction.

15. The method according to claim 1, further comprising the steps of measuring the temperature of said transducer and terminating operation of the ultrasonic generating assembly upon the exceeding of a predetermined temperature limit by the temperature of said transducer.

16. A method for operating, with pulsed electric power and with automatic frequency control, an ultrasonic generating assembly for the atomization of liquid, said ultrasonic generating assembly including an electronic frequency generator having an output stage connected to an electromechanical transducer, said transducer taking the form of a piezoelectric ceramic element connected to a amplitude transformer in turn connected to an atomizer plate, said method comprising the steps of:

(a) measuring, upon the lapse of a first time interval beginning at the onset of a first frequency burst produced by said frequency generator, current flowing through said output stage of said electronic frequency generator, said step of measuring occurring during a second time interval immediately following said first time interval, said first and said second time interval together having a duration less than the duration of said frequency burst;

(b) measuring, upon the lapse of a third time interval beginning at the onset of a second frequency burst produced by said frequency generator after termination of said first frequency burst, current flowing through said output stage, said step (b) occurring during a fourth time interval immediately following said third time interval, said third and said fourth time interval together having a duration less than the duration of said second frequency burst;

(c) temporarily storing in a first memory said first current value upon measurement thereof;

(d) transferring said first current value from said first memory to a second memory upon termination of said first frequency burst and prior to the onset of said second frequency burst;

(e) temporarily storing in said first memory said second current value upon measurement thereof and upon transfer of said first current value to said second memory;

(f) feeding to a threshold circuit said first current signal from said second memory and said second current signal from said first memory;

(g) comparing in said threshold circuit a first current value measured in step (a) with a second current value measured in step (b); and (h) controlling said frequency generator to modify the frequency burst output thereof in accordance with the results of said step of comparing, the modification of the frequency burst output of said frequency generator being limited so that the frequency burst output remains within a frequency band usable for atomization.

17. The method according to claim 16 wherein, in said step of controlling, the frequency burst output of said frequency generator has a frequency increased one step per burst if the difference between said first current value and said second current value is less than a preset lower threshold value.

18. The method according to claim 16 wherein, in said step of controlling, the frequency burst output of said frequency generator has a frequency decreased one step per burst if the difference between said first current value and said second current value is greater than a preset upper threshold value.

* * * * *